(12) United States Patent
Machida

(10) Patent No.: US 7,624,501 B2
(45) Date of Patent: Dec. 1, 2009

(54) METHOD OF MANUFACTURING MULTILAYER WIRING BOARD

(75) Inventor: Yoshihiro Machida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 148 days.

(21) Appl. No.: 12/068,270

(22) Filed: Feb. 5, 2008

(65) Prior Publication Data

US 2008/0184555 A1 Aug. 7, 2008

(30) Foreign Application Priority Data

Feb. 7, 2007 (JP) ............................. 2007-028521

(51) Int. Cl.
*H05K 3/10* (2006.01)
(52) U.S. Cl. ............................. 29/846; 29/830; 29/832; 174/262; 174/263; 174/264; 174/265; 174/266; 264/261; 264/272.15; 264/272.17
(58) Field of Classification Search .................. 29/830, 29/842, 846, 852, 855; 174/262–266, 76; 264/261, 272.15, 272.17
See application file for complete search history.

(56) References Cited

U.S. PATENT DOCUMENTS 5,628,852 A * 5/1997 Ishida ......................... 156/182

2002/0179331 A1 * 12/2002 Brodsky et al. ............. 174/262
2006/0137905 A1 * 6/2006 Kariya et al. ............... 174/255
2008/0168652 A1 * 7/2008 Koyama et al. ............. 29/830

FOREIGN PATENT DOCUMENTS

JP 2004-47816 2/2004

* cited by examiner

*Primary Examiner*—Derris H Banks
*Assistant Examiner*—Jeffrey Carley
(74) *Attorney, Agent, or Firm*—Kratz, Quintos & Hanson, LLP

(57) ABSTRACT

First, a plurality of wiring boards are fabricated at separate steps. The first wiring board includes a Cu post formed on a wiring layer on one surface of a substrate, and a first stopper layer formed at a desired position around the Cu post. The second wiring board includes a through hole for insertion of the Cu post therethrough, a connection terminal formed on a wiring layer on one surface of a substrate, and a second stopper layer that engages the first stopper layer and functions to suppress in-plane misalignment. The third wiring board includes a connection terminal formed on a wiring layer on one surface of a substrate. Then, the wiring boards are stacked up, as aligned with one another so that the wiring layers are interconnected via the Cu post and the connection terminals, to thereby electrically connect the wiring boards. Thereafter, resin is filled into gaps between the wiring boards.

6 Claims, 6 Drawing Sheets

METHOD OF MANUFACTURING MULTILAYER WIRING BOARD

CROSS-REFERENCE TO RELATED APPLICATIONS

This application is based on and claims priority of Japanese Patent Application No. 2007-028521 filed on Feb. 7, 2007, the entire contents of which are incorporated herein by reference.

BACKGROUND OF THE INVENTION (a) Field of the Invention

The present invention relates to a technique for manufacturing a wiring board for use in mounting of a chip component such as a semiconductor device, and more particularly to a method of manufacturing a multilayer wiring board (also called a "semiconductor package") having a multilayer structure adapted to achieve high density and high performance.

(b) Description of the Related Art

Heretofore, a build-up process has been widely used as a technique for manufacturing a multilayer wiring board. Using the build-up process makes it possible to fabricate a variety of multilayer wiring boards by means of materials (typified by resins) for an interlayer dielectric in combinations with via hole formation process. A typical manufacturing process using the build-up process involves repeating, in turn, formation of resin layers (i.e., insulating layers); formation of via holes in the resin layers; and formation of conductive patterns (i.e., wiring layers) in the via holes as well as on the resin layers, thereby building up the layers on both sides of a core substrate (i.e., on the top of and on the bottom of the core substrate) with respect to the core substrate, with the core substrate acting as a base member.

As the art related to the above prior art, for example, Japanese unexamined Patent Publication (JPP) 2004-47816 discloses the following technique. Namely, in the method of manufacturing a multilayer wiring board of the art, a tackifier for tacking an interlayer connector is first selectively applied to the surface of a layer member to be provided with the interlayer connector in a desired shape. Then, the premolded interlayer connector is tacked onto the applied tackifier. After that, a process is performed in which the layer member having the interlayer connector tacked thereon with the tackifier being therebetween, is stacked with one or more of a conductor layer, a wiring board, and prepreg.

As mentioned above, typical wiring formation technique using the conventional build-up process adopts the approach of stacking up, in turn, resin layers (having via holes formed therein) alternating with conductor layers, starting from inside (i.e., core substrate side). Accordingly, the technique has a disadvantage of requiring a considerable time. A larger number of layers stacked up, in particular, lead to a larger number of man-hours correspondingly, resulting in a problem of requiring a longer period of time for manufacture.

Since the layers are formed one after another to form a multilayer wiring structure, the yield of the process also corresponds to yields throughout all steps in the process. For example, in any of the cases where a defective condition is encountered at one of the steps or at all of the steps, the multilayer wiring board finally obtained is judged as a "defective," the shipment of which is not permitted. In other words, the approach of building up the layers one after another, as is the case with the build-up process, has a problem of causing a reduction in the yield of a product (namely, the multilayer wiring board).

Also, conventional multilayer wiring formation technique using the build-up process uses laser and other hole formation processes for via hole formation, and hence requires a land (also called a "connection pad") of appropriate size around a via hole opening. For this reason, the technique cannot meet the demand for fine-diameter formation and pitch reduction. Such a connection pad forms a bottleneck in high-density wiring under recent circumstances where an on-board wiring pitch has become small. The connection pad is disadvantageous in the high-density wiring, because higher wiring density, in particular, leads to a higher percentage of occupation by the connection pads (specifically, a larger area occupied by the connection pads and also a larger number of connection pads installed).

Also, although being formed in the appropriate size allowing for misalignment or the like involved in stacking, the connection pad has a limit to the "appropriate size" permitted to be designed in view of accuracy such as misalignment under the state of the art. This leads to a problem in that the connection pad does not necessarily provide an electrical connection between the boards (i.e., wiring patterns) therethrough, depending on the degree of misalignment or the like.

SUMMARY OF THE INVENTION

An object of the present invention is to provide a method of manufacturing a multilayer wiring board, which achieves a reduction in time period for manufacture and an improvement in yield and enables high-density wiring, and also enables preventing occurrence of misalignment on the occasion of stacking.

To attain the above object, according to the present invention, there is provided a method of manufacturing a multilayer wiring board, including the steps of: fabricating a first wiring board including an insulating base member, wiring layers formed in desired shapes on both sides of the insulating base member, a conductive post formed on the wiring layer on one surface of the insulating base member, and a first stopper layer formed at a desired position around the conductive post, the first stopper layer having such a predetermined shape as may suppress in-plane misalignment that can possibly occur on the occasion of stacking; fabricating a second wiring board including an insulating base member, wiring layers formed in desired shapes on both sides of the insulating base member, a through hole for insertion of the conductive post therethrough, a connection terminal formed on the wiring layer on one surface of the insulating base member, and a second stopper layer that engages the first stopper layer and functions to suppress the in-plane misalignment on the occasion of the stacking; fabricating a third wiring board including an insulating base member, wiring layers formed in desired shapes on both sides of the insulating base member, and a connection terminal formed on the wiring layer on one surface of the insulating base member; stacking up the first, second and third wiring boards, the respective wiring boards being aligned with one another so that the wiring layers thereof are interconnected via the conductive post and the connection terminals, to thereby provide electrical connections through the wiring boards; and filling resin into a gap between adjacent two of the stacked wiring boards.

According to the method of manufacturing a multilayer wiring board according to the present invention, the first, second and third wiring boards are fabricated at separate steps. Then, the wiring boards are superposed one on top of another and connected to one another. Thereafter, the resin is filled into the gaps between the wiring boards, whereby a multilayer wiring structure is formed. Accordingly, the method of the present invention can greatly reduce a time period required for manufacture, as compared with the conventional multilayer wiring formation technique using the build-up process.

The conventional manufacturing method using the build-up process has a problem of causing a reduction in the yield of a product (namely, the multilayer wiring board). This is because, even if a defective condition is encountered at one of all steps, the multilayer wiring board finally obtained is judged as a "defective," the shipment of which is not permitted. As opposed to this, the manufacturing method of the present invention can achieve a great improvement in the yield as compared with the conventional method. This is because, if a defective condition is encountered at any one of the steps, the method of the present invention can discard only a defective part (e.g., the first, second or third wiring board, as employed in this instance) and use a non-defective unit having the same function as the part, in place of the part.

The conventional multilayer wiring formation technique using the build-up process uses a laser-based hole formation process for via hole formation and hence requires provision of a land of appropriate size around the via hole opening. This in turn becomes a factor responsible for hindrance to fine-diameter formation or pitch reduction, and hence forms a bottleneck in high-density wiring. As opposed to this, the method of the present invention makes it possible to contribute to achievement of high-density wiring. This is because using the conductive post (e.g., a copper (Cu) post) as the interboard connection terminal makes it adaptable to the fine-diameter formation and the pitch reduction.

Moreover, the first wiring board is provided with the first stopper layer formed in the predetermined shape at the desired position around the conductive post, and the second wiring board having the through hole for insertion of the conductive post therethrough is also provided with the second stopper layer. Thereby, when the wiring boards are vertically stacked on, the respective stopper layers can engage each other so as to suppress the in-plane misalignment. This makes it possible to prevent the wiring layers of the second wiring board exposed from inner walls of the through holes from coming into electrical contact with sidewalls of the conductive posts.

Detailed description will be given with reference to embodiments of the present invention to be described later, with regard to other features in process, advantages based thereon, and the like, of the method of manufacturing a multilayer wiring board according to the present invention.

DESCRIPTION OF THE PREFERRED EMBODIMENTS

Description will be given below with regard to preferred embodiments of the present invention with reference to the accompanying drawings.

Figure 1:
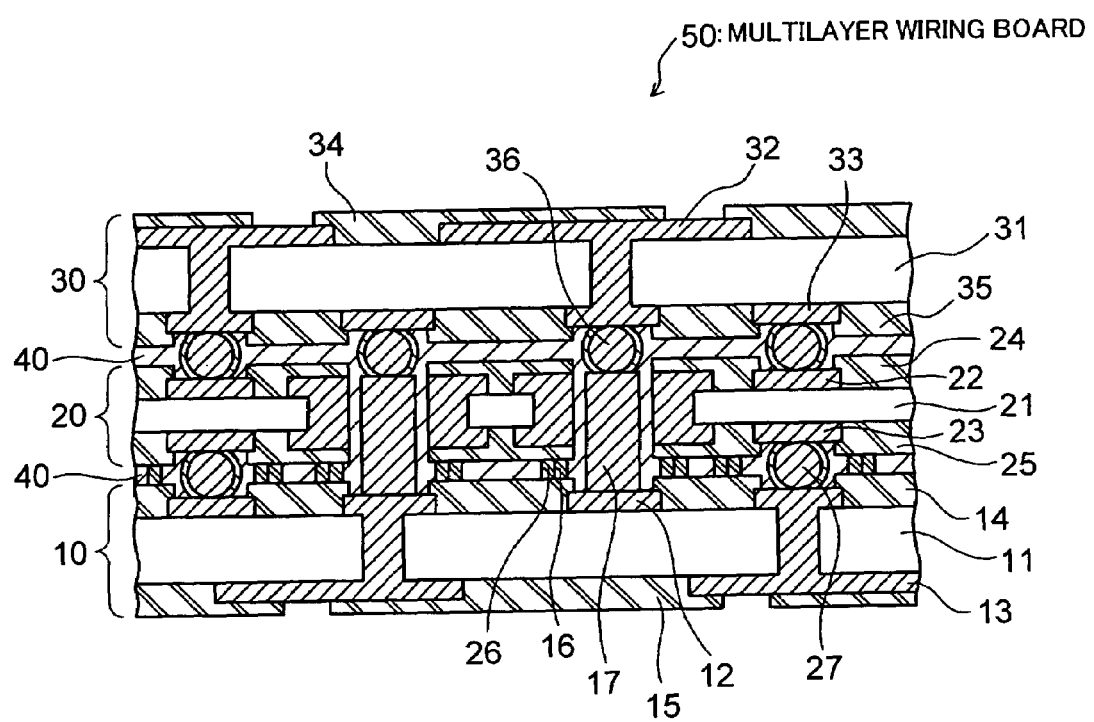
FIG. 1 is a cross-sectional view showing an example of the configuration of a multilayer wiring board as manufactured using a method of manufacturing a multilayer wiring board according to an embodiment of the present invention.

FIG. 1 shows in cross-sectional view an example of the configuration of a multilayer wiring board as manufactured using a method of manufacturing a multilayer wiring board according to an embodiment of the present invention.

As shown in FIG. 1, a multilayer wiring board 50 according to the embodiment includes three wiring boards 10, 20 and 30 stacked vertically one on top of another, and resin layers (i.e., insulating layers) 40 formed to fill in between the adjacent ones of the wiring boards 10, 20 and 30. Hereinafter, the lowermost one, namely the wiring board 10, of the wiring boards stacked will be also called a "lower wiring board" for the sake of convenience, and likewise, the intermediate one, namely the wiring board 20, will be also called a "middle wiring board," and the uppermost one, namely the wiring board 30, will be also called an "upper wiring board."

Figure 6A:
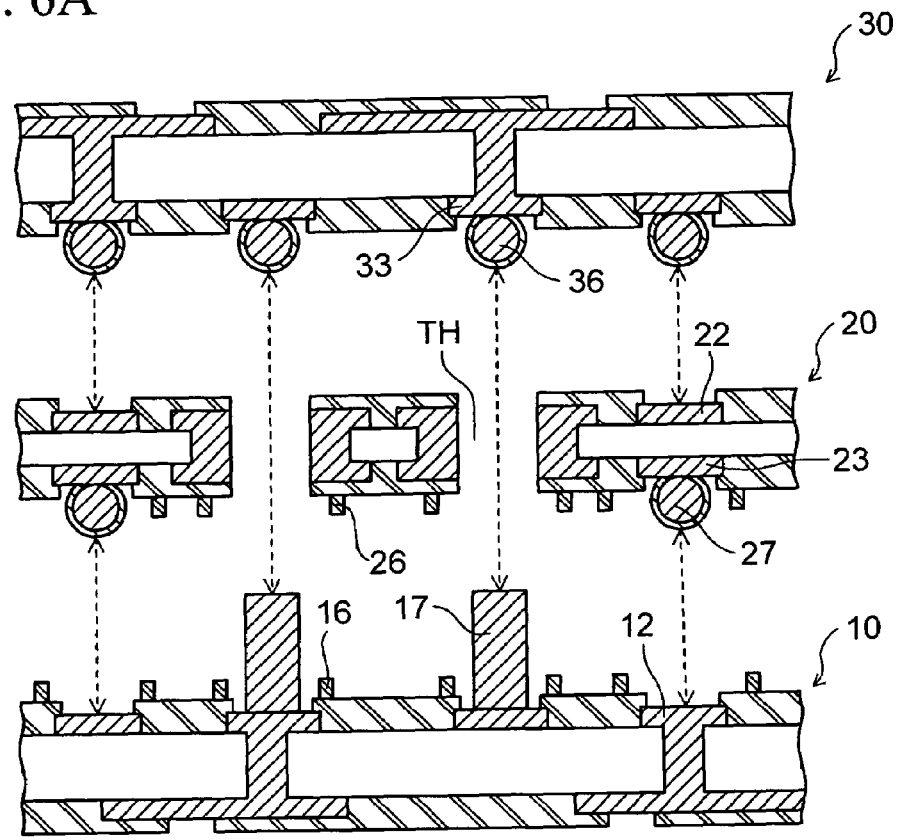
FIGS. 6A and 6B are cross-sectional views showing a method of manufacturing the multilayer wiring board shown in FIG. 1 (specifically, manufacturing steps for parts involved in stacking of the wiring boards and resin filling).
Figure 6B:
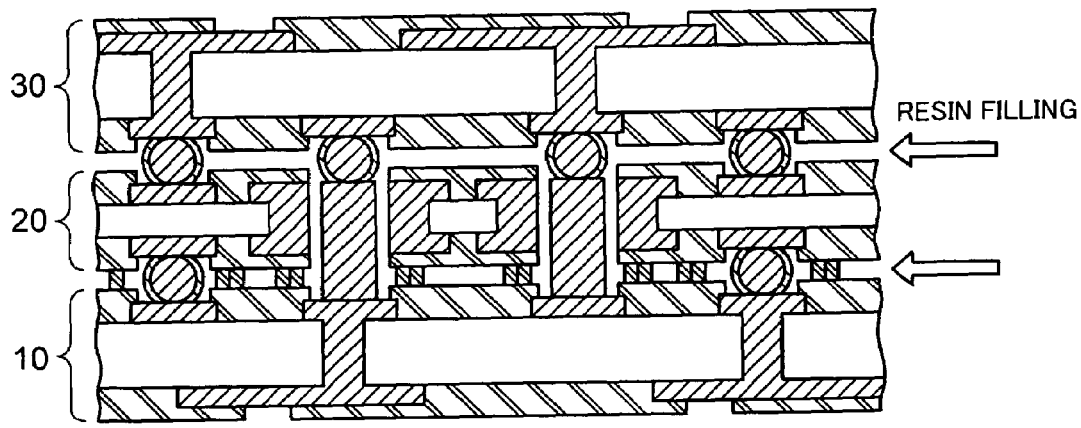

The lower wiring board 10 includes a resin substrate 11 used as a base member, wiring layers 12 and 13, and permanent resist layers (i.e., insulating layers) 14 and 15. The wiring layers 12 and 13 are formed in desired shapes on both sides of the resin substrate 11 by means of patterning, and the permanent resist layers 14 and 15 are formed in desired shapes by means of patterning. The wiring layers 12 and 13 each have pad sections defined at predetermined positions, and the insulating layers 14 and 15 are formed to cover the entire surface except the pad sections of the wiring layers 12 and 13, respectively. Of the insulating layers, the insulating layer 15 exposed to the outside also functions as a protection film for the wiring board 50. The lower wiring board 10 also includes conductive posts (e.g., copper (Cu) posts 17 as employed in the embodiment) that function as interboard connection terminals, which are formed at predetermined positions on the wiring layer 12 on the inside surface of the wiring board 10 (i.e., on the surface of the wiring board 10, facing the middle wiring board 20). The lower wiring board 10 further includes "dam sections 16" that characterize the present invention, which are formed at desired positions on the insulating layer 14 on the surface on which the Cu posts 17 are formed. The dam sections 16 are formed as shaped like fish's fins and standing in a stacking direction. The dam sections 16 are formed at required positions as shown clearly in FIG. 6A to be discussed later (e.g., at eight positions as shown in FIG. 6A), and are formed at least in regions around the Cu posts 17. The dam sections 16 engage corresponding dam sections, respectively, provided on the middle wiring board 20 as will be mentioned later, so as to serve the function of suppressing in-plane misalignment that can possibly occur on the occasion of stacking of the wiring boards, i.e., so as to function as stopper layers for anti-misalignment.

As in the case of the lower wiring board 10, the middle wiring board 20 includes a resin substrate 21 used as a base member, wiring layers 22 and 23, and permanent resist layers (i.e., insulating layers) 24 and 25. The wiring layers 22 and 23 are formed in desired shapes on both sides of the resin substrate 21 by means of patterning, and the permanent resist layers 24 and 25 are formed in desired shapes on the resin substrate 21 and also on the wiring layers 22 and 23, respectively, by means of patterning. Likewise, the wiring layers 22 and 23 each have pad sections defined at predetermined positions, and the insulating layers 24 and 25 are formed to cover the entire surface except the pad sections of the wiring layers 22 and 23, respectively. The middle wiring board 20 also includes, at predetermined positions, through holes (i.e., parts indicated by reference character TH in FIG. 6A) that serve to insert therethrough the Cu posts 17 provided on the lower wiring board 10. Further, the middle wiring board 20 includes conductive balls or conductive bumps (e.g., Cu core solder balls 27 as employed in the embodiment) that function as interboard connection terminals, which are formed at desired positions on the wiring layer 23 on the underside of the wiring board 20 (i.e., on the surface of the wiring board 20, facing the lower wiring board 10). The middle wiring board 20 further includes "dam sections 26" that characterize the present invention, which are formed at desired positions on the insulating layer 25 on the surface on which the Cu core solder balls 27 are formed. Likewise, the dam sections 26 are formed as shaped like fish's fins and standing in the stacking direction, at plural positions as shown clearly in FIG. 6A to be discussed later (e.g., at seven positions as shown in FIG. 6A). The dam sections 26 function as stopper layers for anti-misalignment.

Figure 4A:
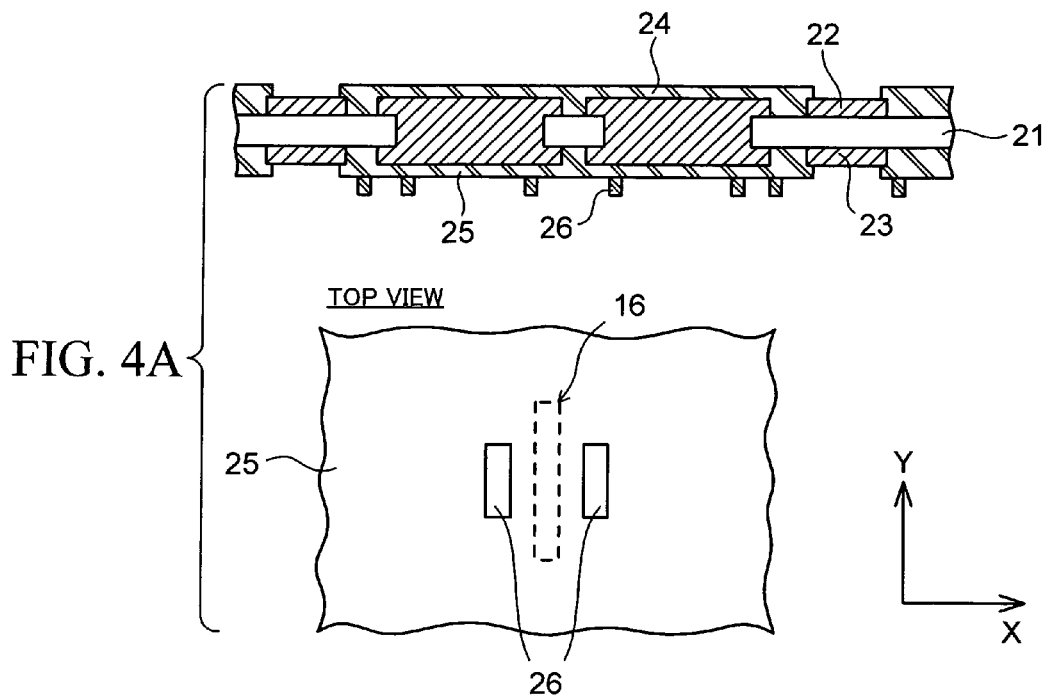
FIGS. 4A to 4C are cross-sectional views (partly in top view) showing a method of manufacturing the multilayer wiring board shown in FIG. 1 (specifically, manufacturing steps for parts involved in a middle wiring board)

The dam sections 26 provided on the middle wiring board 20 and the dam sections 16 provided on the lower wiring board 10, as seen in plan view, assume a "slender shape" as schematically shown in FIG. 4A. The dam sections 16 and 26 are formed so that two stopper layers (namely, the dam sections 26) are disposed substantially parallel to each other on both sides of one stopper layer (namely, the dam section 16) with the dam section 16 being sandwiched therebetween, as shown in FIG. 4A. With this arrangement, when the wiring boards 10 and 20 are vertically stacked on, the dam sections 16 and 26 engage each other and function to prevent occurrence of the in-plane misalignment (e.g., the misalignment along the X axis as shown in FIG. 4A) that can possibly occur on the occasion of the stacking.

As in the case of the lower wiring board 10 and the middle wiring board 20, the upper wiring board 30 includes a resin substrate 31 used as a base member, wiring layers 32 and 33, and permanent resist layers (i.e., insulating layers) 34 and 35. The wiring layers 32 and 33 are formed in desired shapes on both sides of the resin substrate 31 by means of patterning, and the permanent resist layers are formed in desired shapes on the resin substrate 31 and also on the wiring layers 32 and 33, respectively, by means of patterning. Likewise, the wiring layers 32 and 33 each have pad sections defined at predetermined positions, and the insulating layers 34 and 35 are formed to cover the entire surface except the pad sections of the wiring layers 32 and 33, respectively. Of the insulating layers, the insulating layer 34 exposed to the outside also functions as a protection film for the wiring board 50. The upper wiring board 30 further includes conductive balls or conductive bumps (e.g., Cu core solder balls 36 as employed in the embodiment) that function as interboard connection terminals, which are formed at desired positions on the wiring layer 33 on the underside of the wiring board 30 (i.e., on the surface of the wiring board 30, facing the middle wiring board 20).

The inner wiring layer 12 of the lower wiring board 10 and the lower wiring layer 23 of the middle wiring board 20 are electrically connected via the Cu core solder balls 27 provided on the middle wiring board 20. The inner wiring layer 12 of the lower wiring board 10 and the lower wiring layer 33 of the upper wiring board 30 are electrically connected via the Cu posts 17 provided on the lower wiring board 10 and the Cu core solder balls 36 provided on the upper wiring board 30 (e.g., two inner terminals as shown in FIG. 1). The upper wiring layer 22 of the middle wiring board 20 and the lower wiring layer 33 of the upper wiring board 30 are electrically connected via the Cu core solder balls 36 provided on the upper wiring board 30 (e.g., two outer terminals as shown in FIG. 1).

Also, the resin substrates 11, 21 and 31 that constitute the base members for the wiring boards 10, and 30, respectively, can take any form, provided that each substrate has conductor layers formed at least on the outermost layers and that the conductor layers are electrically connected through the inside of the substrate. The resin substrates 11, 21 and 31 may take the form of having wiring layers formed therein or the form of having no wiring layers formed therein. If the resin substrate takes the form of having the wiring layers formed therein, the outermost conductor layers are electrically connected via the wiring layers formed in the substrate with an insulating layer being provided therebetween and a via hole through which the wiring layers are interconnected, which is not specifically shown since this is not a part that characterizes the present invention. For example, the board in this form includes a wiring board of multilayer structure that can be formed using build-up process. On the other hand, if the resin substrate takes the form of having no wiring layers formed therein, the outermost conductor layers are electrically connected via a through hole appropriately formed in the resin substrate at a desired position. For example, the board in this form includes a core substrate that corresponds to a base member for the multilayer wiring board formed using the above-mentioned build-up process.

Incidentally, electrode terminals of a chip component such as a semiconductor device mounted on the wiring board 50 are connected via solder bumps or the like to the pad sections exposed from the upper insulating layer 34 of the wiring board 50. Metal bumps (or balls), metal pins, or the like, which function as external connection terminals for use in packaging of the wiring board 50 on a motherboard or the like, are bonded via solder or the like to the pad sections exposed from the lower insulating layer 15 of the wiring board 50.

What characterizes the multilayer wiring board 50 according to the embodiment is as follows. The wiring boards 10, 20 and 30 are fabricated through separate steps as will be mentioned later. On the occasion of stacking the fabricated wiring boards 10, 20 and 30, the connection terminals 27 are used to provide an electrical connection between the lower wiring board 10 and the middle wiring board 20 therethrough. The Cu posts 17 and the connection terminals 36 are used to provide an electrical connection between the lower wiring board 10 and the upper wiring board 30 therethrough. In addition, the connection terminals 36 are used to provide an electrical connection between the middle wiring board 20 and the upper wiring board 30 therethrough.

What further characterizes the multilayer wiring board 50 according to the embodiment is as follows. The lower wiring board 10 having the Cu posts 17 is provided with the dam sections 16 formed at the desired positions on the insulating layer 14. Also, the middle wiring board 20 having the through holes TH for insertion of the Cu posts 17 therethrough is provided with the dam sections 26 formed at the desired positions on the insulating layer 25 (e.g., at such positions that the relative positions of the dam sections 16 and 26 are as shown in FIG. 4A), whereby when the wiring boards 10 and 20 are vertically stacked on, the dam sections 16 and 26 engage each other. Accordingly, occurrence of the in-plane misalignment (e.g., the misalignment along the X axis as shown in FIG. 4A) involved in the stacking is prevented.

Specific description will be given with regard to materials, sizes, and others for structural members that constitute the multilayer wiring board 50 according to the embodiment, in connection with a process to be described below.

Description will be given below with regard to a method of manufacturing the multilayer wiring board 50 according to the embodiment with reference to FIGS. 2A to 6B showing manufacturing steps in the method.

(Fabrication of the Lower Wiring Board 10: See FIGS. 2A to 2C and 3A to 3C)

At the first step (FIG. 2A), there is fabricated a structure formed of the resin substrate 11 used as the base member, and the wiring layers 12 and 13 formed in the desired shapes on both sides of the resin substrate 11 by means of patterning. As mentioned above, the resin substrate 11 can take any form, provided that the substrate has the conductor layers formed at least on the outermost layers and that the conductor layers are electrically connected through the inside of the substrate. Fabrication of the structure can be accomplished, for example, by a process as given below, using a core substrate for general use in the multilayer wiring board formed by build-up process.

Figure 2A:
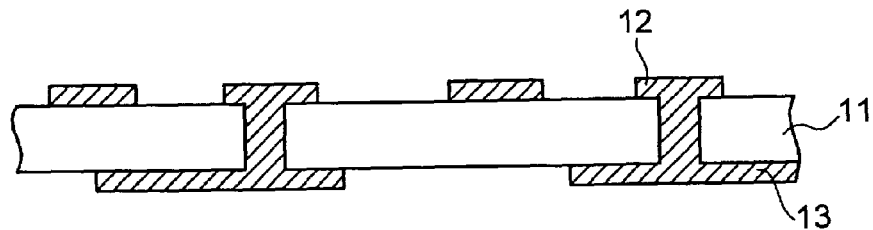
FIGS. 2A to 2C are cross-sectional views (partly in top view) showing a method of manufacturing the multilayer wiring board shown in FIG. 1 (specifically, manufacturing steps for parts involved in a lower wiring board)

First, the resin substrate 11 is prepared by first laminating a desired number of sheets of prepreg to thereby form the laminated prepreg (for example, of about 60 µm thick). Prepreg is an adhesive sheet in semicured, B-stage form, made of glass cloth impregnated with a thermosetting resin such as an epoxy resin, a polyimide resin, a bismaleimide triazine (BT) resin or a polyphenylene ether (PPE) resin, with the glass cloth functioning as a reinforcement material. Then, copper foil (for example, of about 2 to 3 µm thick) is overlaid on both sides of the prepreg and applied heat and pressure to the prepreg having the copper foil overlaid thereon. In this case, the copper foil formed on both sides of the prepreg corresponds to the "conductor layers," which in turn are used as power feed layers (i.e., seed layers) for electroplating. Then, through holes are formed in the resin substrate 11 at desired positions (e.g., two positions as shown in FIG. 2A). The through holes TH can be formed using such hole formation process that uses a carbon dioxide ($CO_2$) laser, a yttrium aluminum garnet (YAG) laser or the like, or that uses a mechanical drill. Further, additional conductor layers (i.e., the conductor layers to form the wiring layers 12 and 13) are formed on both sides of the resin substrate 11 to fill in the through holes formed in the resin substrate 11, by means of copper electroplating with the above-mentioned conductor layers (i.e., the copper foil) being used as the power feed layers.

Then, resists for etching are formed using a patterning material on the conductor layers formed on both sides. Then, openings are formed in predetermined portions of the resists. The opening portions are formed by patterning according to required shapes of the wiring layers 12 and 13 to be formed. A photosensitive dry film or a liquid photoresist can be used as the patterning material. For example, where the dry film is used, the formation of resist layers (not shown) involves first cleaning the surfaces of the conductor layers, and then laminating the dry films (each having a thickness of about 25 µm) onto the conductor layers by thermocompression bonding. Then, the dry films are exposed under ultraviolet (UV) irradiation using masks (not shown) formed in the required shapes of the wiring patterns by patterning. Further, the portions are etched away using a predetermined developing solution (e.g., an organic-solvent-containing developing solution for a negative resist, or an alkali-base developing solution for a positive resist). Thereby, the resist layers are formed according to the required shapes of the wiring patterns. Likewise, where the liquid photoresist is used, the resist layers can be formed in the required shapes by patterning through process steps of: surface cleaning; resist surface covering; drying; exposure; and development.

Then, the exposed conductor layers (Cu) are removed by wet etching using a chemical liquid soluble only in copper (Cu), using as masks the resist layers formed by patterning. After that, the resist layers on both sides are removed, for example, by an alkaline chemical liquid such as sodium hydroxide or a monoethanolamine-base liquid. Thereby, the wiring layers 12 and 13 of the required shapes are exposed on both sides of the resin substrate 11, as shown in FIG. 2A.

At the next step (FIG. 2B), the permanent resist layers (i.e., the insulating layers) 14 and 15 are formed in required shapes by patterning, on both sides of the structure obtained at the previous step. A photosensitive solder resist (e.g., a dry film or a liquid photoresist) can be used as a material for the permanent resist layer. Formation of the permanent resist layers (i.e., the insulating layers) 14 and 15 can be accomplished, for example, by laminating photosensitive dry film resists onto the resin substrate 11 and the wiring layers 12 and 13, and by forming the resists in the required shapes (specifically, the shapes except the pad sections defined at the predetermined positions on the wiring layers 12 and 13) by patterning.

Figure 2B:
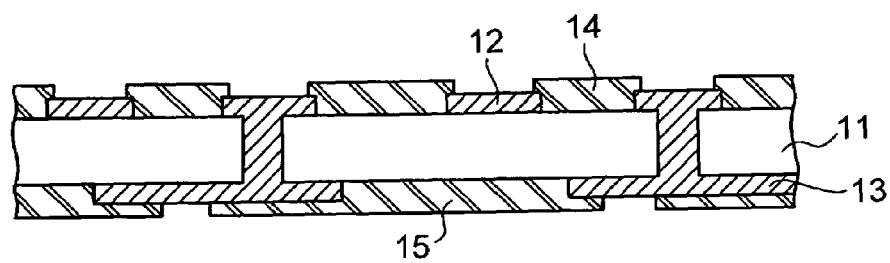
Figure 2C:
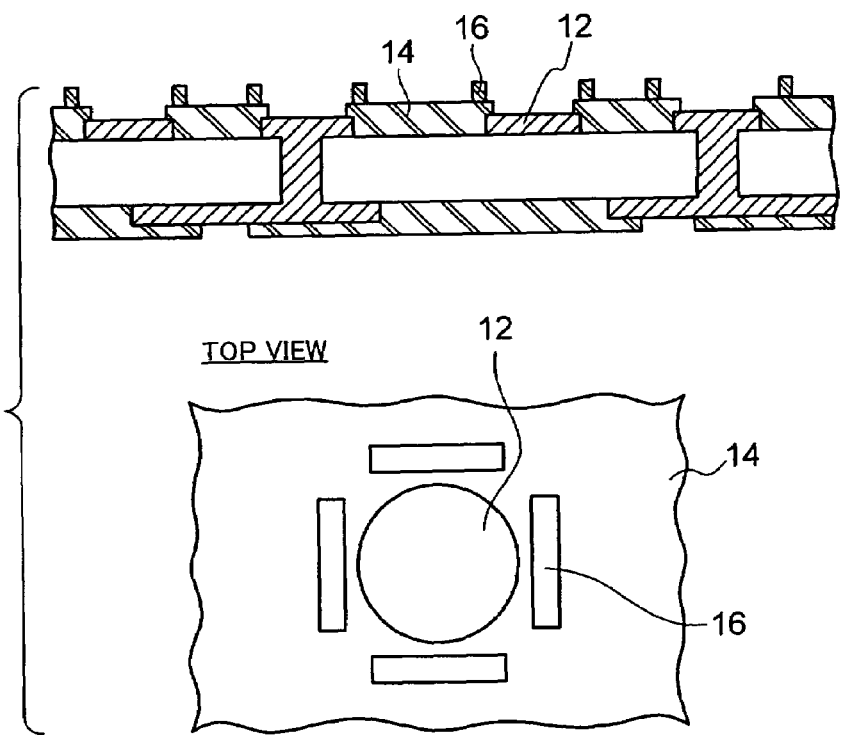
Figure 3A:
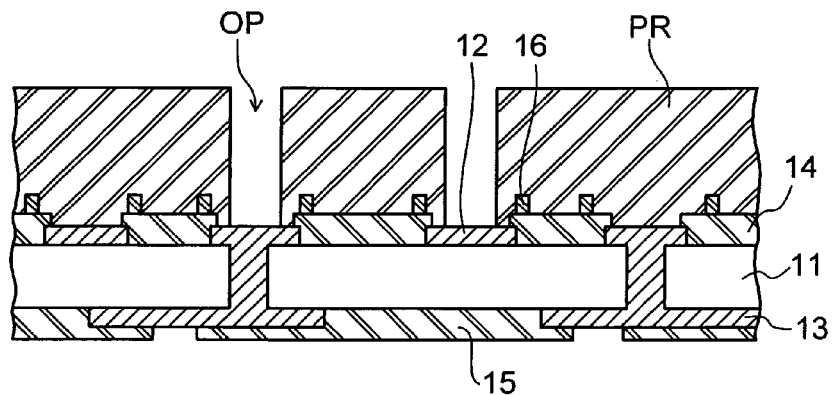
FIGS. 3A to 3C are cross-sectional views showing steps following the steps shown in FIGS. 2A to 2C.
Figure 3B:
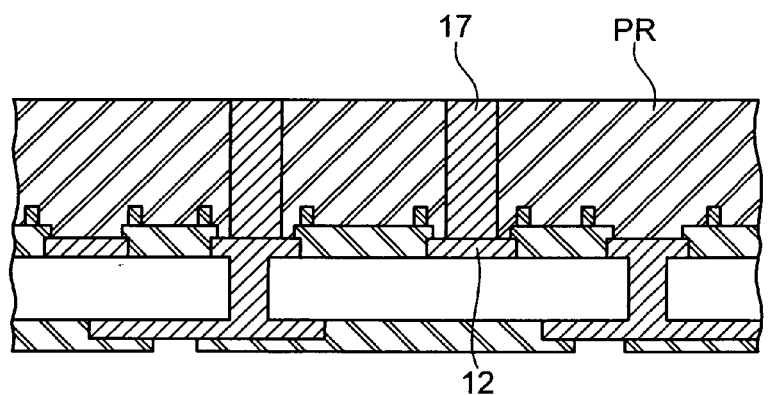
Figure 3C:
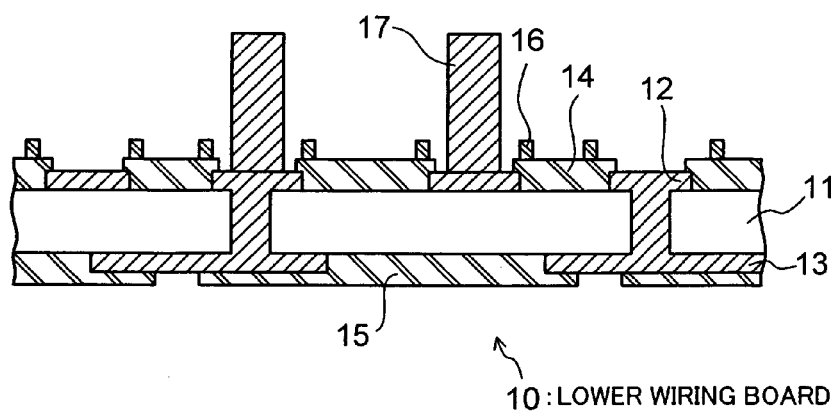

At the next step (FIG. 2C), the dam sections 16 that function as the stopper layers for anti-misalignment are formed by patterning at plural predetermined positions on the insulating layer 14 on one side of the structure obtained at the previous step (e.g., on the top of the structure as shown in FIG. 2C). The dam sections 16 are formed as being shaped like the "fins," standing in the stacking direction, and having the "slender shape" in cross section as schematically shown in a top view in the lower part of FIG. 2C. As shown in FIG. 2C, a circular portion (namely, pad section) of the wiring layer 12 surrounded by four dam sections 16 is exposed from the resist layer 14. The Cu post to be described later is formed in the circular portion (i.e., the pad section). The height of the dam section 16 to be formed is set to about 20 to 40 µm. The length of the dam section 16 (i.e., the length of the pattern having the "slender shape" as seen in plan view) is set to an appropriate length allowing for misalignment, inaccuracy in fabrication, or the like, involved in the stacking of the wiring boards. The same material as that for the permanent resist layers (i.e., the insulating layers) 14 and 15 mentioned above (namely, the photosensitive solder resist) is used as the patterning material. Also, resist patterning can be carried out in the same manner as the process performed at the step shown in FIG. 2B. Specifically, photolithography technique can be used to etch away the portion of the resist to thereby form the dam section 16 (i.e., the permanent resist layer) according to the required shape.

At the next step (FIG. 3A), a resist for plating is formed using a patterning material on one side of the structure obtained at the previous step (i.e., on the surface on which the dam sections 16 are formed). Then, openings OP are formed in predetermined portions of the resist. The opening OP is formed by patterning according to the required shape of the copper (Cu) post to be formed. For example, a resist layer PR is formed as follows. A photosensitive dry film (of about 100 µm thick) is first laminated to the one side of the structure by thermocompression bonding. Then, the dry film is subjected to exposure and development (i.e., subjecting the dry film to patterning) using a mask (not shown) formed by patterning according to the shape of the Cu post to be formed at the next step. Thereafter, the predetermined portions are etched away (i.e., the openings OP are formed).

At the next step (FIG. 3B), the Cu posts 17 each having the height of about 100 μm are formed by applying copper (Cu) electroplating to the surface of the wiring layer 12 exposed from the openings OP, with the wiring layers 12 and 13 being used as power feed layers, using as a mask the resist layer PR formed by patterning.

At the next step (FIG. 3C), the plating resist layer PR (see FIG. 3B) is removed by an alkaline chemical liquid such as sodium hydroxide or a monoethanolamine-base liquid.

The above steps lead to the fabrication of a structure (namely, the lower wiring board 10) having the resin substrate 11, the wiring layers 12 and 13, the insulating layers (i.e., the permanent resist layers) 14 and 15; the Cu posts 17, and the dam sections 16. Specifically, the wiring layers 12 and 13 are formed in the required shapes on both sides of the resin substrate 11 by patterning; the insulating layers 14 and 15 are formed to cover the entire surface except the pad sections of the wiring layers 12 and 13, respectively, defined at the predetermined positions; the Cu posts 17 are formed on the wiring layer 12 on one surface; and the dam sections 16 are formed around the Cu posts 17 at the required positions on the insulating layer 14.

(Fabrication of the Middle Wiring Board 20: See FIGS. 4A to 4C)

At the first step (FIG. 4A), a structure is fabricated in the same manner as the processes performed at the steps of FIGS. 2A to 2C discussed above. Specifically, there is fabricated a structure having the resin substrate 21; the wiring layers 22 and 23, the insulating layers (i.e., the permanent resist layers) 24 and 25; and the dam sections 26. More specifically, the wiring layers 22 and 23 are formed in the required shapes on both sides of the resin substrate 21 by patterning. The permanent resist layers 24 and 25 are formed to cover the entire surface except the pad sections of the wiring layers 22 and 23, respectively, defined at the predetermined positions. Then, the dam sections are formed at plural required positions on the insulating layer 25 on one surface (e.g., on the underside as shown in FIG. 4A). The dam sections 26 are formed as having the same height as the dam sections 16 provided on the lower wiring board 10, being shaped like the "fins," standing in the stacking direction. The dam sections 26 has the "slender shape" in cross section as schematically shown in a top view in the lower part of FIG. 4A. Two dam sections 26 are formed substantially parallel to each other on both sides of the dam section 16 (shown by dashed line in FIG. 4A) provided on the lower wiring board 10, with the dam section 16 being provided therebetween, as shown in FIG. 4A. With this arrangement, when the wiring boards 10 and 20 are vertically stacked on, the dam sections 16 and 26 can engage each other to prevent occurrence of the misalignment along the X axis.

Figure 4B:
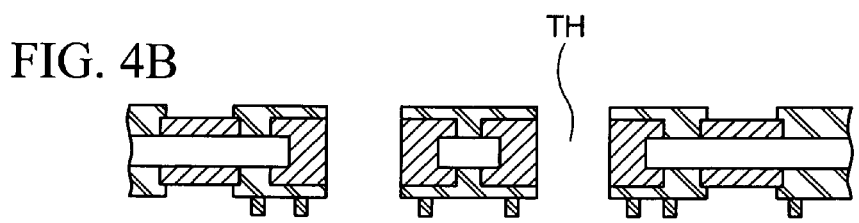

At the next step (FIG. 4B), the through holes TH for insertion of the Cu posts 17 provided on the lower wiring board 10 are formed in the structure fabricated at the previous step, at predetermined positions (e.g., at two positions as shown in FIG. 4B). The through holes TH can be formed using such hole formation process that uses a $CO_2$ laser, a YAG laser or the like, or that uses a mechanical drill.

Figure 4C:
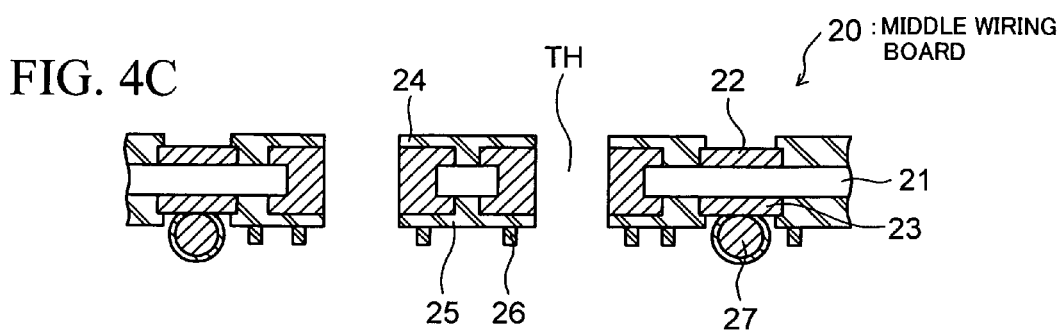

At the next step (FIG. 4C), the Cu core solder balls 27 that function as interboard connection terminals are bonded to the wiring layer 23 on one side of the structure fabricated at the previous step (i.e., on the side on which the dam sections 26 are formed), at the required positions (e.g., on two pad sections as shown in FIG. 4C). Incidentally, the Cu core solder ball, as employed herein, refers to the ball of composite structure containing copper as a core and solder that covers the core.

The above steps lead to the fabrication of a structure (namely, the middle wiring board 20) having the resin substrate 21; the wiring layers 22 and 23, the insulating layers (i.e., the permanent resist layers) 24 and 25, the through holes TH, the connection terminals (e.g., the Cu core solder balls) 27 and the dam sections 26. Specifically, the wiring layers 22 and 23 are formed in the required shapes on both sides of the resin substrate 21 by patterning. Then, the permanent resist layers 24 and 25 are formed to cover the entire surface except the pad sections of the wiring layers 22 and 23, respectively, defined at the predetermined positions. Thereafter, the through holes TH are formed at the predetermined positions, and the Cu core solder balls are formed at the required positions on the wiring layer 23 on one surface. The dam sections 26 are formed at the required positions on the insulating layer 25 on the surface on which the connection terminals 27 are formed.

In the above-mentioned fabrication method, the through holes TH are formed after the wiring layers 22 and 23, the insulating layers (i.e., the permanent resist layers) 24 and 25 and the dam sections 26 are formed on the resin substrate 21. However, other fabrication methods may be adopted to form the through holes TH at the first stage. A fabrication method as employed in this case will be described below, which is not specifically shown.

First, a double-sided copper-clad laminate (which corresponds to the resin substrate 21) is prepared by overlaying copper foil (for example, of about 2 to 3 μm thick) on both sides of prepreg (for example, of about 60 μm thick), and by applying heat and pressure to the prepreg having the copper foil overlaid thereon. Then, through holes TH for insertion of the Cu posts 17 provided on the lower wiring board 10 are formed in the resin substrate 21 at predetermined positions. The through holes TH can be formed using such hole formation process that uses a $CO_2$ laser, a YAG laser or the like, or that uses a mechanical drill. Then, additional conductor layers (i.e., the conductor layers to form the wiring layers 22 and 23) are formed on both sides of the resin substrate 21 to fill the through holes TH formed in the resin substrate 21, by means of copper electroplating with the copper foil being used as power feed layers. Then, resists for etching are formed using a patterning material (e.g., a photosensitive dry film or a liquid photoresist) on the conductor layers formed on both sides. Thereby, openings are formed in predetermined portions of the resists. The opening portions are formed by patterning according to the required shapes of the wiring layers 22 and 23 to be formed. Then, the exposed conductor layers (Cu) are removed by wet etching, using as masks the resist layers formed by patterning. Further, the resist layers on both sides are removed. Thereby, the wiring layers 22 and 23 of the required shapes are exposed on both sides of the resin substrate 21.

Next, the permanent resist layers (i.e., the insulating layers) 24 and 25 are formed in the required shapes by patterning, on both sides of the resin substrate 21 on which the wiring layers 22 and 23 are exposed. A photosensitive solder resist can be used as a material for the permanent resist layer. Formation of the insulating layers 24 and 25 can be accomplished, for example, by laminating photosensitive dry film resists to both sides, and patterning the resists in the required shapes (specifically, the shapes except the pad sections defined at the predetermined positions on the wiring layers 22 and 23). Then, the dam sections 26 are formed at the required positions on the insulating layer 25 on one surface, while holding their predetermined relative positions. Thereafter, the interboard connection terminals (e.g., the Cu core solder balls 27) are bonded, at the desired positions, to the wiring layer 23 on the side on which the dam sections 26 are formed. Thereby, the middle wiring board 20 is brought to completion.

This fabrication method has the merits of facilitating the formation of the through holes TH and also of achieving a high degree of accuracy of position thereof.

(Fabrication of the Upper Wiring Board 30: See FIGS. 5A and 5B)

At the first step (FIG. 5A), a structure is fabricated in the same manner as the processes performed at the steps of FIGS. 2A to 2C discussed above. Specifically, there is fabricated a structure having the resin substrate 31; the wiring layers 32 and 33 formed in the required shapes on both sides of the resin substrate 31 by patterning; and the insulating layers (i.e., the permanent resist layers) 34 and 35 formed to cover the entire surface except the pad sections of the wiring layers 32 and 33, respectively, defined at the predetermined positions.

Figure 5A:
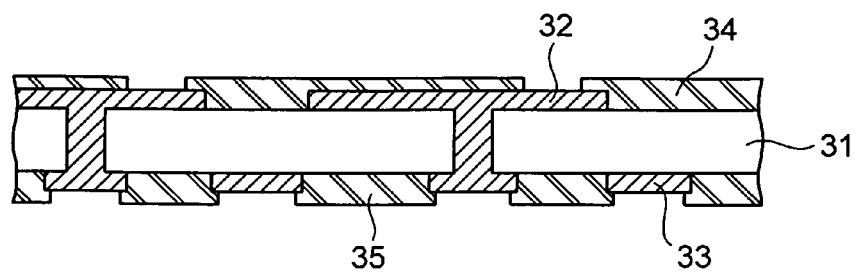
FIGS. 5A and 5B are cross-sectional views showing a method of manufacturing the multilayer wiring board shown in FIG. 1 (specifically, manufacturing steps for parts involved in an upper wiring board)
Figure 5B:
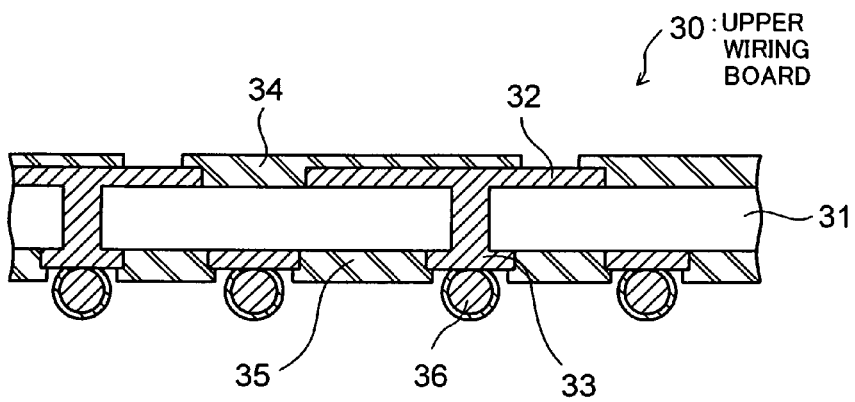

At the next step (FIG. 5B), in the same manner as the process performed at the step of FIG. 4C discussed above, the Cu core solder balls 36 that function as interboard connection terminals are bonded to the wiring layer 33 on one side of the structure fabricated at the previous step (i.e., on the surface of the structure, facing the middle wiring board 20 on the occasion of stacking), at the required positions (e.g., on four pad sections as shown in FIG. 5B).

The above steps lead to the fabrication of a structure (namely, the upper wiring board 30) having the resin substrate 31, the wiring layers 32 and 33, the insulating layers (i.e., the permanent resist layers) 34 and 35, and the connection terminals (e.g., the Cu core solder balls) 36. Specifically, the wiring layers 32 and 33 are formed in the required shapes on both sides of the resin substrate 31 by patterning. Then, the permanent resist layers 34 and 35 are formed to cover the entire surface except the pad sections of the wiring layers 32 and 33, respectively, defined at the predetermined positions. Moreover, the Cu core solder balls 36 are formed at the required positions on the wiring layer 33 on one surface.

(Stacking of the Wiring Boards 10, 20 and 30 and Resin Filling: See FIGS. 6A and 6B)

At the first step (FIG. 6A), the wiring boards (namely, the lower wiring board 10, the middle wiring board 20 and the upper wiring board 30) fabricated separately through the above-mentioned steps are superposed one on top of another and thereby electrically connected to one another.

First, the wiring boards 10, 20 and 30 are stacked up, as aligned with one another in the following manner. The wiring layer 12 (i.e., the pad sections) of the lower wiring board 10 corresponds to the connection terminals 27 bonded to the wiring layer 23 (i.e., the pad sections) of the middle wiring board 20; the tops of the Cu posts 17 formed on the wiring layer 12 (i.e., the pad sections) of the lower wiring board 10 correspond to the connection terminals 36 bonded to the wiring layer 33 (i.e., the pad sections) of the upper wiring board 30; and also, the wiring layer 22 (i.e., the pad sections) of the middle wiring board 20 corresponds to the connection terminals 36 bonded to the wiring layer 33 (i.e., the pad sections) of the upper wiring board 30. In this case, the dam sections 16 provided on the lower wiring board 10 and the dam sections 26 provided on the middle wiring board 20 are aligned with each other so that the dam section 16 is sandwiched between the dam sections 26, as seen in plan view (FIG. 4A). "Pin lamination" is used for the stacking of the wiring boards 10, 20 and 30. This method is to pin the relative positions of the wiring boards by inserting guide pins into reference holes for alignment previously formed in the peripheries of the wiring boards at desired positions. Thereby, the three wiring boards 10, 20 and 30 are electrically interconnected via the corresponding interboard connection terminals (namely, the Cu posts 17 and the Cu core solder balls 27 and 36).

Further, as needed, a reflow furnace and baking are used in combination to melt the solder on the outer surfaces of the Cu core solder balls 27 and 36 to thereby provide tight connections between the Cu core solder balls 27 and 36, and the Cu posts 17 and the wiring layers 12 and 22 (i.e., the pad sections).

At the next step (FIG. 6B), resin is filled into gaps between the adjacent ones of the wiring boards 10, 20 and 30 stacked and interconnected at the previous step. Resin filling is performed for the purposes of ensuring insulation of the wiring boards 10, 20 and 30 from one another, and also of imparting strength to the wiring board of multilayer structure to thereby prevent an occurrence of warpage.

A material used for the filling resin is a thermoplastic epoxy resin for general use in a molding resin, a liquid epoxy resin for general use in an underfill resin, or the like. The thermoplastic epoxy resin has a modulus of elasticity of 15 to 30 GPa and a coefficient of thermal expansion (CTE) of 5 to 15 ppm per degree. Further, this thermoplastic epoxy resin contains about 70% to 90% of a filler added thereto (e.g., fine particles of inorganic matter such as silica, alumina, or calcium silicate) in order to control the modulus of elasticity and the CTE of the resin, and so on. The liquid epoxy resin has a modulus of elasticity of 5 to 15 GPa and a CTE of 20 to 40 ppm per degree and contains about 60% to 80% of a filler added thereto. Preferably, transfer molding can be used as a resin filling method. Besides the transfer molding, injection molding, underfill flow molding, or other methods, may be used for the resin filling.

The above steps lead to manufacture of a structure (namely, the multilayer wiring board 50 shown in FIG. 1) having the lower wiring board 10, the middle wiring board 20, and the upper wiring board 30, which are electrically connected to one another and stacked up, and having the resin layers (i.e., the insulating layers 40 shown in FIG. 1) formed to fill in between the adjacent ones of the stacked wiring boards 10, 20 and 30.

As described above, according to the method of manufacturing a multilayer wiring board according to the embodiment (FIGS. 2A to 6B), the wiring boards (namely, the lower wiring board 10, the middle wiring board 20, and the upper wiring board 30) that constitute the multilayer wiring board are fabricated separately, and the wiring boards are appropriately superposed one on top of another and electrically connected to one another to form a multilayer wiring structure (namely, the multilayer wiring board 50 shown in FIG. 1). Consequently, the method according to the embodiment can greatly reduce a time period required for manufacture, as compared with the conventional multilayer wiring formation method using build-up process.

The conventional manufacturing method using the build-up process has a problem of causing a reduction in the yield of a product (namely, the multilayer wiring board). This is because, even if a defective condition is encountered at one of all steps, the multilayer wiring board finally obtained is judged as a "defective," the shipment of which is not permitted. As opposed to this, the manufacturing method according to the embodiment can achieve a great improvement in the yield as compared with the conventional method. This is because, if a defective condition is encountered at any one of the steps, the method according to the embodiment can discard only a defective part (e.g., the lower wiring board 10, the middle wiring board 20 or the upper wiring board 30, as employed in this case) and use a non-defective unit having the same function as the part, in place of the part.

Also, the method according to the embodiment is adaptable to fine-diameter formation and pitch reduction because the Cu post 17 is used as the interboard connection terminal. Specifically, the conventional multilayer wiring formation technique using the build-up process uses a laser-based hole formation process for via hole formation and hence requires provision of a land (or a connection pad) of appropriate size around the via hole opening. This in turn becomes a factor responsible for hindrance to the fine-diameter formation or the pitch reduction. However, in the embodiment, plating method as mentioned above is used to form the Cu post 17 with an area of fine diameter. This contributes to achievement of high-density wiring, because of making it possible to route wiring patterns closely adjacent to the Cu post.

Also, the lower wiring board 10 having the Cu posts 17 is provided with the dam sections 16 formed in a predetermined shape at the required positions on the insulating layer 14, and the middle wiring board 20 having the through holes TH for insertion of the Cu posts 17 therethrough is provided with the dam sections 26 formed in a predetermined shape at the required positions (FIG. 4A) on the insulating layer 25 on the surface of the wiring board 20, facing the lower wiring board 10. This makes it possible to effectively prevent an occurrence of the in-plane misalignment (e.g., the misalignment along the X axis as shown in FIG. 4A), when the wiring boards 10 and 20 are vertically stacked on. Accordingly, the wiring layers 22 and 23 of the middle wiring board 20 exposed from inner walls of the through holes TH can be prevented from coming into electrical contact with sidewalls of the Cu posts 17 (i.e., prevention of the wiring layers from electrical-shorting with the Cu posts 17).

The heights of the Cu posts 17 formed on the lower wiring board 10 are not necessarily at the same level. In such a case (i.e., the case where there are variations in the heights of the Cu posts 17), the Cu core solder balls 36 provided on the upper wiring board 30, which are bonded to the tops of the Cu posts 17, have the merit of being able to function as members for absorbing the variations.

For the embodiment mentioned above, description has been given taking the case where a set of three wiring boards, namely, the lower wiring board 10 having the Cu posts 17, the middle wiring board 20 having the through holes TH for insertion of the Cu posts 17 therethrough and the interboard connection terminals (e.g., the Cu core solder balls 27), and the upper wiring board 30 having the interboard connection terminals (e.g., the Cu core solder balls 36), form a semiconductor package (namely, the multilayer wiring board 50). However, it is to be, of course, understood that the number of wiring boards that forms the package is not limited to three, as is also apparent from the subject matter of the present invention. The number of wiring boards stacked may be appropriately set to three, six, . . . , using the above set as a unit, according to the function required for a semiconductor package to be constituted. In this case, the formation of the multilayer structure is accomplished by the following steps. First, a desired number of multilayer wiring boards 50 fabricated through the steps shown in FIGS. 2A to 6B is prepared. Next, conductive material, such as solder balls, is deposited on the pad sections (i.e., the wiring layer 13 or 32) exposed from one of the adjacent multilayer wiring boards. Then, the conductive material is used to provide an electrical connection to the corresponding pad sections (i.e., the wiring layer 32 or 13) of the other wiring board therethrough, and resin is filled into gaps between the wiring boards.

In addition, for the embodiment mentioned above, description has been given taking the case where the Cu core solder balls 27 and 36 are bonded to the middle wiring board 20 and the upper wiring board 30, respectively, as the interboard connection terminals. However, it is to be, of course, understood that the form of the interboard connection terminal is not limited to this. For example, a conductive bump such as a gold (Au) bump or a solder bump, or a conductive ball such as a resin core ball (e.g., a ball of composite structure containing resin as a core and metal (mainly, solder or a nickel-gold alloy) that covers the core) may be appropriately used.

Moreover, for the embodiment mentioned above, description has been given taking the case where the dam sections 16 to be formed on the lower wiring board 10 having the Cu posts 17 and the dam sections 26 to be formed on the middle wiring board 20 having the through holes TH for insertion of the Cu posts 17 therethrough are formed so that the dam section 16 is sandwiched between the dam sections 26, as viewed along the X axis, as shown in FIG. 4A. However, it is to be, of course, understood that the dam sections 16 and 26 are not limited to taking this form. It is essential only that the dam sections provided on one wiring board and the dam sections provided on the other wiring board engage each other so that the dam sections can function as the stopper layers for suppressing the occurrence of misalignment in a given direction that can possibly occur on the occasion of the stacking of the wiring boards. The positions of the dam sections formed, the shapes of the dam sections, the number of dam sections installed, and others, may be appropriately selected.

For the embodiment mentioned above, description has been given taking the case where the resin layers (i.e., the insulating layers 40) alone are interposed between the adjacent ones of the stacked wiring boards 10, 20 and 30. However, a semiconductor (e.g., silicon) device, a chip component, or the like, may be buried in the gaps between the wiring boards, as needed.

What is claimed is:

1. A method of manufacturing a multilayer wiring board, comprising the steps of:

fabricating a first wiring board including an insulating base member, wiring layers formed in desired shapes on both sides of the insulating base member, a conductive post formed on the wiring layer on one surface of the insulating base member, and a first stopper layer formed at a desired position around the conductive post, the first stopper layer having such a predetermined shape as may suppress in-plane misalignment that can possibly occur on the occasion of stacking;

fabricating a second wiring board including an insulating base member, wiring layers formed in desired shapes on both sides of the insulating base member, a through hole for insertion of the conductive post therethrough, a connection terminal formed on the wiring layer on one surface of the insulating base member, and a second stopper layer that engages the first stopper layer and functions to suppress the in-plane misalignment on the occasion of the stacking;

fabricating a third wiring board including an insulating base member, wiring layers formed in desired shapes on both sides of the insulating base member, and a connection terminal formed on the wiring layer on one surface of the insulating base member;

stacking up the first, second and third wiring boards, the respective wiring boards being aligned with one another so that the wiring layers thereof are interconnected via the conductive post and the connection terminals, to thereby provide electrical connections through the wiring boards; and filling resin into a gap between adjacent two of the stacked wiring boards.

2. The method of manufacturing a multilayer wiring board, according to claim 1, wherein the step of fabricating the first wiring board includes the steps of:

forming conductor layers on both sides of the insulating base member, and patterning the conductor layers in desired shapes to thereby form the wiring layers;

forming permanent resists on the insulating base member and the wiring layers on both sides, and patterning the resists in shapes except pad sections defined at predetermined positions on the wiring layers, to thereby form insulating layers;

forming the first stopper layer on the insulating layer on the side facing the second wiring board on the occasion of stacking; and forming the conductive post on a region surrounded by the first stopper layer, on the wiring layer on the side where the first stopper layer is formed.

3. The method of manufacturing a multilayer wiring board, according to claim 1, wherein the step of fabricating the second wiring board includes the steps of:

forming conductor layers on both sides of the insulating base member, and patterning the conductor layers in desired shapes to thereby form the wiring layers;

forming permanent resists on the insulating base member and the wiring layers on both sides, and patterning the resists in shapes except pad sections defined at predetermined positions on the wiring layers, to thereby form insulating layers;

forming the second stopper layer on the insulating layer on the side facing the first wiring board on the occasion of stacking;

forming the through hole for insertion of the conductive post therethrough, at a desired position in a structure fabricated through the above steps; and forming the connection terminal on the wiring layer on the side where the second stopper layer is formed.

4. The method of manufacturing a multilayer wiring board, according to claim 1, wherein the step of fabricating the second wiring board includes the steps of:

forming the through hole for insertion of the conductive post therethrough, at a desired position in the insulating base member;

forming conductor layers on both sides of the insulating base member having the through hole formed therein, and patterning the conductor layers in desired shapes to thereby form the wiring layers;

forming permanent resists on the insulating base member and the wiring layers on both sides, and patterning the resists in shapes except pad sections defined at predetermined positions on the wiring layers, to thereby form insulating layers;

forming the second stopper layer on the insulating layer on the side facing the first wiring board on the occasion of stacking; and forming the connection terminal on the wiring layer on the side where the second stopper layer is formed.

5. The method of manufacturing a multilayer wiring board, according to claim 1, wherein the step of fabricating the third wiring board includes the steps of:

forming conductor layers on both sides of the insulating base member, and patterning the conductor layers in desired shapes to thereby form the wiring layers;

forming permanent resists on the insulating base member and the wiring layers on both sides, and patterning the resists in shapes except pad sections defined at predetermined positions on the wiring layers, to thereby form insulating layers; and forming the connection terminal on the wiring layer on the side facing the second wiring board on the occasion of stacking.

6. The method of manufacturing a multilayer wiring board, according to claim 1, wherein one of the first and second stopper layers is formed in a slender shape extending in a direction perpendicular to the direction of misalignment that can possibly occur on the occasion of stacking, and the other is formed such that, on the occasion of the stacking, two layers in a slender shape extend substantially parallel to each other on both sides of the one stopper layer with being sandwiched therebetween.

* * * * *